United States Patent
Oh et al.

[11] Patent Number: 6,008,135
[45] Date of Patent: Dec. 28, 1999

[54] METHOD FOR ETCHING METAL LAYER OF A SEMICONDUCTOR DEVICE USING HARD MASK

[75] Inventors: Sang-Jeong Oh, Yongin; Yong-tak Lee, Seoul, both of Rep. of Korea

[73] Assignee: Samsung Electronics Co., Ltd., Suwon, Rep. of Korea

[21] Appl. No.: 09/140,325

[22] Filed: Aug. 26, 1998

[30] Foreign Application Priority Data

Nov. 13, 1997 [KR] Rep. of Korea ........................ 97-59717

[51] Int. Cl.$^6$ ........................................................ H01L 21/00
[52] U.S. Cl. .............................. 438/720; 216/47; 216/51; 216/75; 216/76; 438/736; 438/742
[58] Field of Search .................................... 438/706, 720, 438/722, 736, 742; 216/47, 51, 67, 75, 76; 252/79.1

[56] References Cited

U.S. PATENT DOCUMENTS 5,236,550  8/1993  Abt et al. .............................. 438/720 X
5,515,984  5/1996  Yokoyama et al. ................. 438/720 X
5,840,200  11/1998  Nakagawa et al. ................. 438/736 X

*Primary Examiner*—William Powell
*Attorney, Agent, or Firm*—Jones Volentine, LLP

[57] ABSTRACT

A method for etching a metal layer of a semiconductor device is provided. A metal layer formed on a substrate is etched using a hard mask and a mixed etching gas containing chlorine and oxygen in which the ratio of oxygen gas is preferably about 0.5–0.8. Under such conditions, a metal layer pattern of a fine profile is formed. Since the hard mask is thin, it is possible to prevent etch reactants generated in a process of etching the metal layer from being deposited on the side surface of the resultant formed of the metal layer pattern and the hard mask. As a result, no additional processing is required to remove the etch reactants from the side surfaces and the metal layer etching process is simplified.

7 Claims, 2 Drawing Sheets

METHOD FOR ETCHING METAL LAYER OF A SEMICONDUCTOR DEVICE USING HARD MASK

BACKGROUND OF THE INVENTION

1. Field of the Invention

The present invention relates to a method for manufacturing a semiconductor device, and more particularly to a method for etching a metal layer using $TiO_2$ as a hard mask.

2. Description of the Related Art

The capacitance of a capacitor is proportional to the area of the electrodes and the dielectric constant of the dielectric layer between electrodes, and is inversely proportional to the distance between the electrodes. Therefore, high integration of a semiconductor device narrows the distance between the electrodes, thus increasing the capacitance of the capacitor.

In semiconductor devices, in particular, semiconductor memory devices, the capacitor is used to store data. The data stored in the capacitor must be maintained without change until it is read. Also, the data stored in the capacitor must be prevented from being damaged by a soft error generated by an external influence such as an α particle. Accordingly, a semiconductor memory device requires a capacitor with a sufficient capacitance to permit it to store and maintain data in spite of external influences, in a highly integrated state.

To meet such needs, various methods of maximizing the area of the storage node of the capacitor in a narrow area have been devised. One of the methods is to make the storage node three-dimensional, such as a stack type, a cylinder type, and a fin type. This method has the advantage that the area of the storage node is increased. However, the manufacturing process is complicated and the method may not be useful for highly integrated devices.

Another method is to use a dielectric layer having a high dielectric constant. BST, $PZT(Pb(Zr,Ti)O_3)$, and Y1 are examples of such dielectric layers. These dielectric layers have a dielectric constant of at least several hundred times that of a conventional NO or $Ta_2O_5$ film. The high dielectric constant provides enough capacitance, even when the semiconductor device is highly integrated.

In order to use the high dielectric layer as the dielectric layer of the capacitor, a heat-resistant metal layer compatible with the high dielectric layer must be used as the electrode of the capacitor. A Pt film is widely used for this. The Pt film is oxidation-resistant in an oxygen atmosphere at a high temperature, and is advantageous to the growth of the high dielectric layer.

In the heat-resistant metal such as Pt, an evaporation degree of etch reactants is low. Therefore, the etch reactants adhere to the Pt film and serve as an etching mask. As a result, the side wall slope of the etched Pt film becomes positive. Also, the etch ratio of the Pt film is very low. Therefore, when the Pt film is patterned using a photoresist as a mask, the photoresist must be excessively thick, making it hard to form a fine pattern.

A method for etching the Pt film according to a conventional technology is provided in the U.S. Pat. No. 5,515,984; "Method for etching Pt film", issued May 14, 1996. In the method provided in this patent, an additional process of wet-etching after etching the Pt film is necessary in order to remove the Pt compound. Therefore, the process is complicated.

SUMMARY OF THE INVENTION

To solve the above problems, it is an objective of the present invention to provide a method for etching a metal layer of a semiconductor device which requires no additional processes after patterning a metal layer, by preventing an etching reactant from adhering to the metal layer or the side surface of an etching mask, thus simplifying the process.

To achieve this objective, there is provided a method for etching a metal layer of a semiconductor device, performed in the following order. A first metal layer is formed on a substrate. A hard mask is formed on the first metal layer. A hard mask pattern is formed on the first metal layer by etching the hard mask. The first metal layer is etched using the hard mask pattern as an etching mask and a mixed etching gas containing oxygen and chlorine or chloride. The oxygen ratio in the mixed etching gas is about 0.2–0.8. In this process, it is preferable that the oxygen ratio is about 0.5–0.8.

After etching the first metal layer, the hard mask pattern is removed. A dielectric layer is formed on the first metal layer and a second metal layer is formed on the dielectric layer. The second metal layer is patterned by forming a second hard mask pattern on the second metal layer.

In order to form the hard mask pattern, a soft mask that is softer than the hard mask is formed on the hard mask. The soft mask is patterned the hard mask is etched using the patterned soft mask as an etching mask.

The first and second metal layers are heat-resistant metal layers or metal oxide layers. They can be formed from the group consisting of a Pt film, an Ir film, a Rh film, a Ru film, an $IrO_2$ film, a $RuO_2$ film, and $RhO_2$ film. However, they are preferably formed of the Pt film. The hard mask is formed of $TiO_2$.

In the method for etching the metal layer of the semiconductor device according to the present invention, a hard mask such as a $TiO_2$ film is used. Also, the oxygen ratio in the mixed etching gas is about 0.2–0.8, preferably about 0.5–0.8. A mixed gas including chlorine gas is used as the etching gas. When the metal layer is etched under these conditions, a metal layer in pattern which the tilt angle of side surfaces is more than 80° is formed. It is possible to make the hard mask thin since an etch selectivity between the metal layer and the hard mask is at least 10:1. It is possible to prevent the etching reactant generated during a process of patterning the metal layer from being deposited on the side surface of a resultant formed of the metal layer and the hard mask by etching the metal layer using the thin hard mask. Therefore, it is possible to simplify the process of etching the metal layer since no process is needed to remove the etching reactant from the side surface.

BRIEF DESCRIPTION OF THE DRAWING(S)

The above objectives and advantages of the present invention will become more apparent by the following detailed description of a preferred embodiment thereof with reference to the attached drawings in which:

FIGS. 1 through 3 are sectional views showing the steps of a method for etching a metal layer using a hard mask according to an embodiment of the present invention; and FIG. 4 is a graph showing the etch ratio and etch selectivity of an etching gas with respect to the metal layer and the hard mask, according to the embodiment of the present invention.

DESCRIPTION OF THE PREFERRED EMBODIMENTS

Figure 1:
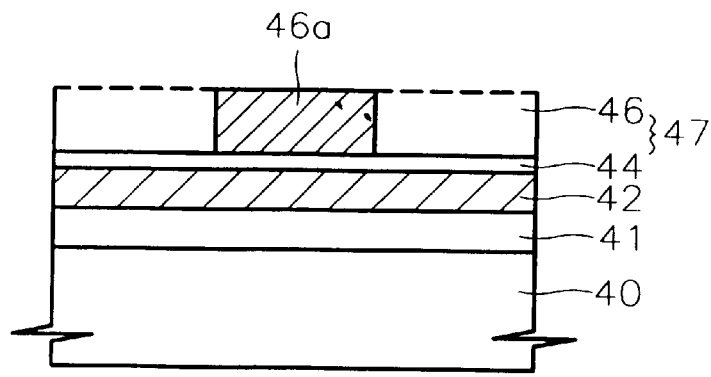

Referring to FIG. 1, an insulating layer 41 is formed on a semiconductor substrate 40. A metal layer 42 is formed on the insulating layer 41 to a thickness of about 2,000 A. The metal layer 42 is a heat-resistant layer or an oxide film. For example, the metal layer 42 may be one selected from the group consisting of a Pt film, an Ir film, a Rh film, a Ru film, an $IrO_2$ film, a $RuO_2$ film, and a $RhO_2$ film. A double layered mask 47 comprised of a first mask 44 and a second mask 46 is formed on the metal layer 42. The first mask 44 used for etching the metal layer 42 is formed to a thickness of about 500 A. Considering that the metal layer 42 is a heat-resistant metal layer such as a Pt film and the etch ratio of the Pt film is lower than that of a general metal layer, it is preferable that the first mask 44 is a hard mask such as a $TiO_2$ film.

The second mask 46, which is a material softer than the first mask 44, is an etching mask for patterning the first mask 44. The second mask 46 is formed using a photosensitive film such as a photoresist film. The dotted line portions of second mask 46 denote the portions removed in the following process.

An etch reactant is generated in the following process of etching the metal layer 42. By-products removed from the metal layer 42 are combined with the etch gases, thus forming the etch reactants. The etch reactants are deposited on the side surface of the metal layer 42 and the side surface of the first mask 44 when the metal layer 42 is etched. In order to prevent the etch reactants from being deposited, it is preferable that the side surface of the first mask 44 is formed so as to have a small area by forming the first mask 44 as thin as possible. Therefore, the first mask 44 is preferably the hard mask having a high etch selectivity (for example, more than 10:1) with respect to the metal layer 42. It is thus possible to prevent the etch reactants from being deposited on the side surface of the metal layer 42. The amount of the etch reactants is small, if any. Therefore, the deposited etch reactants are easily removed without excessive etching.

A second mask pattern 46a for defining a predetermined area of the first mask 44 is formed by exposing the second mask 46. A predetermined area of the first mask 44 is defined by the second mask pattern 46a. Since an area of the metal layer 42 is defined by the defined portion of the first mask 44 in the following process, the result is that the metal layer 42 is defined by the second mask pattern 46a.

Figure 2:
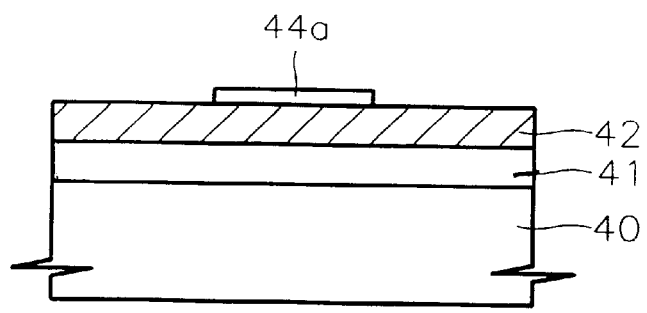

Referring to FIG. 2, the first mask 44 is dry etched until the surface of the metal layer 42 is exposed using the second mask pattern 46a as an etching mask. The second mask pattern 46a is removed, leaving a first mask pattern 44a formed on the metal layer 42 for defining a predetermined area thereon.

Figure 3:
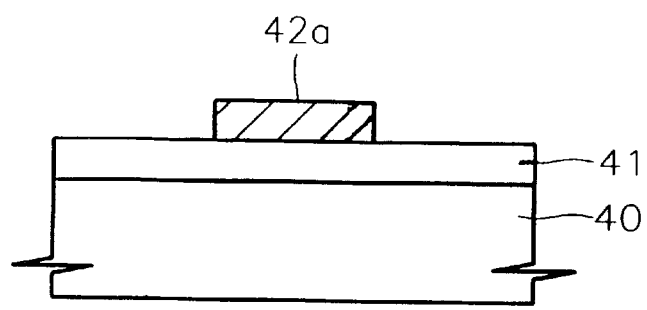

Referring to FIG. 3, the entire surface of the resultant structure on which the first mask pattern 44a is formed is anisotropically etched. As a result, a metal layer pattern 42a is formed on the semiconductor substrate 40.

According to one embodiment of the present invention, a mixed gas containing oxygen gas and chlorine gas or chloride gas is used as an etching gas to form the metal layer pattern 42a. The portion of oxygen gas ($O_2/(O_2+Cl_2)$) in the mixed gas is about 0.2–0.8 and preferably about 0.5–0.8, in order to maintain the etch selectivity more than 10:1 between the metal layer 42 and the first mask pattern 44a.

Figure 4:
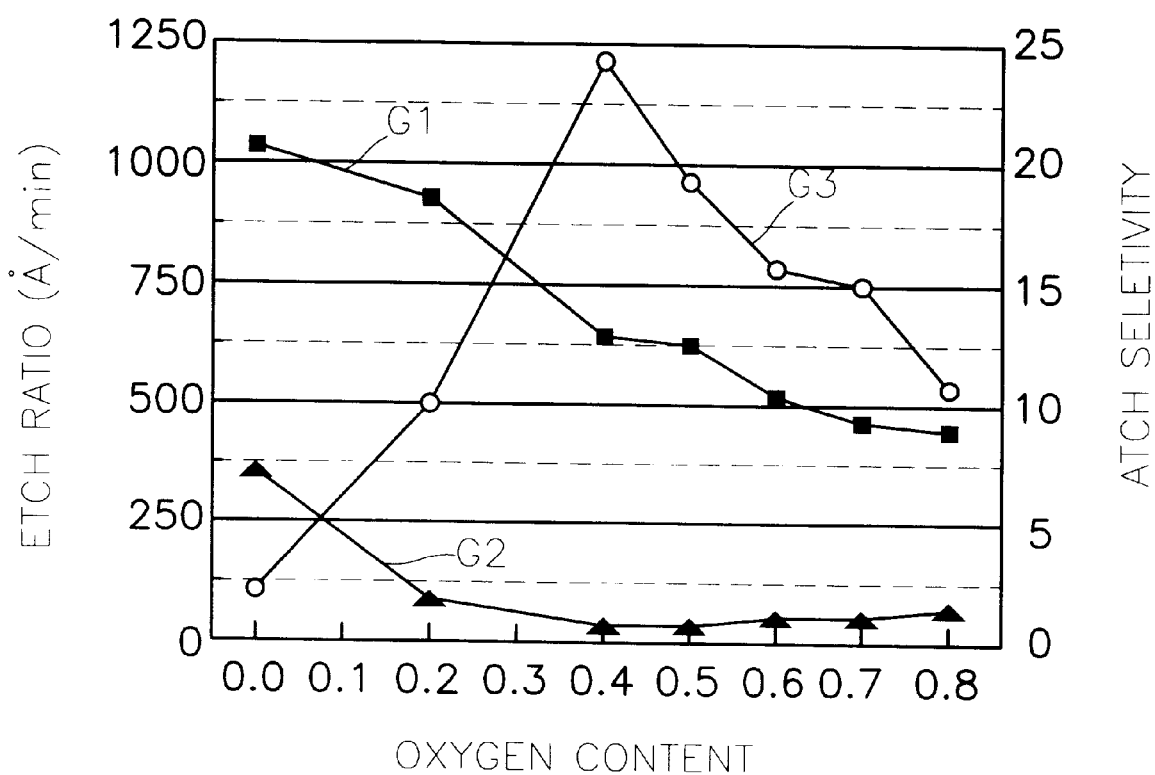

FIG. 4 is a graph showing the etch ratio and etch selectivity of an etching gas with respect to the metal layer and the hard mask, according to the embodiment of the present invention.

To be specific, the horizontal axis shows the content of oxygen gas in the mixed gas. The left vertical axis shows the etch rate (Å/min) of the metal layer 42 and the first mask pattern 44a. The right vertical axis shows the etch selectivity between the metal layer 42 and the first mask pattern 44a.

Also, the first plot (G1) of FIG. 4 shows the change of the etch rate of the metal layer 42 such as the Pt film according to the change of the oxygen content. The second plot (G2) shows the change of the etch rate of the first mask pattern 44a. The third plot (G3) shows the change of the etch selectivity between the metal layer 42 and the first mask pattern 44a.

Referring to the first and second plots (G1 and G2), the etch rate of the metal layer 42 is much higher than the etch rate of the first mask pattern 44a. Accordingly, it is noted from the oxygen content that the etch selectivity between the metal layer 42 and the first mask pattern 44a is more than 10:1. Moreover, when the oxygen content is about 0.4, the etch rate of the metal layer 42 is about 630.6 Å/min and the etch rate of the first mask pattern 44a is about 26 Å/min. The etch selectivity between the metal layer 42 and the first mask pattern 44a is about 24.3:1.

As mentioned above, the method for etching the metal layer using the hard mask according to the present invention uses a hard mask such as the $TiO_2$ film and a mixed etching gas containing chlorine gas in which the oxygen content is about 0.2–0.8 (preferably about 0.5–0 8), in order to pattern the metal layer such as the Pt film that is used as an electrode. When the metal layer is patterned under such conditions, a metal layer pattern having a side surface tilt angle (with respect to the horizontal surface) of more than 80° is formed. Since the etch selectivity between the metal layer and the hard mask is more than 10:1, the hard mask can be made thin. It is possible to prevent the etch reactants generated during the process of patterning the metal layer from being deposited on the side surfaces of the metal layer and the hard mask. Therefore, it is possible to simplify the process for etching the metal layer, since no additional processing is needed for removing the etch reactants from the side surface.

What is claimed is:

1. A method for etching a metal layer of a semiconductor device, comprising the steps of:

(a) forming a first metal layer on a substrate;

(b) forming a hard mask on the first metal layer;

(c) forming a hard mask pattern on the first metal layer; and (d) etching the first metal layer using a mixed etching gas containing oxygen gas and chlorine gas or chloride gas, in which the ratio of oxygen to the total mixed etching gas is about 0.2–0.8.

2. The method of claim 1, wherein the step (c) comprises the steps of:

forming a soft mask which is softer than the hard mask on the hard mask;

patterning the soft mask;

patterning the hard mask using the patterned soft mask as an etching mask; and removing the patterned soft mask.

3. The method of claim 1, wherein the hard mask has an etch selectivity of more than about 10:1 with respect to the first metal layer.

4. The method of claim 1, wherein the hard mask is a $TiO_2$ film.

5. The method of claim 1, wherein the oxygen ratio in the mixed etching gas is about 0.4.

6. The method of claim 1, after the step (d), further comprising the steps of:

(e) removing the hard mask pattern;
(f) forming a dielectric layer on the first metal layer;
(g) forming a second metal layer on the dielectric layer; and
(h) etching the second metal layer by forming a second hard mask pattern on the second metal layer.

7. The method of claim 6, wherein the first and second metal layers are each selected from the group consisting of a Pt film, an Ir film, a Rh film, a Ru film, an $IrO_2$ film, a $RuO_2$ film, and a $RhO_2$ film.

* * * * *